United States Patent
Oyamatsu

(12) 
(10) Patent No.: US 6,204,539 B1
(45) Date of Patent: Mar. 20, 2001

(54) SEMICONDUCTOR APPARATUS AND MANUFACTURING METHOD THEREFOR

(75) Inventor: Hisato Oyamatsu, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/392,591

(22) Filed: Sep. 9, 1999

(30) Foreign Application Priority Data

Sep. 9, 1998 (JP) .................................................. 10-255512

(51) Int. Cl.$^7$ .................................................. H01L 29/72

(52) U.S. Cl. .......................... 257/382; 257/383; 257/387; 257/401; 257/412; 257/751; 257/754; 438/289; 438/655; 438/694

(58) Field of Search ..................................... 257/382, 383, 257/387, 401, 412, 751, 754; 438/289, 655, 694

(56) References Cited

U.S. PATENT DOCUMENTS 5,864,155 * 1/1999 Melzner ................. 257/382

FOREIGN PATENT DOCUMENTS 11-087703   3/1999   (JP) .

* cited by examiner

*Primary Examiner*—Edward Wojciechowicz
(74) *Attorney, Agent, or Firm*—Banner & Witcoff, Ltd.

(57) ABSTRACT

In a MISFET incorporating a silicide compound made of metal having a high melting point and formed on an impurity diffusion layer for the drain and source, a MISFET disclosed herein comprises an impurity diffusion layer for the drain and source, a gate insulating film, a gate electrode, a side-wall insulating film formed on the side wall of the gate electrode, an interlayer insulating film having an opened portion including a side-portion removed region obtained by removing a portion of the side portion of the side-wall insulating film on an impurity diffusion layer for the drain and source, a silicide compound layer formed on the impurity diffusion layer for the drain and source, the silicide compound layer being formed on the bottom surface of the opening of the interlayer insulating film corresponding to the side-portion removed region, and a conductor formed in the opening and made contact with the silicide compound layer. This structural feature lowers the contact resistance by maintaining a sufficiently large contact area of a source and drain diffusion layer without a necessity of elongating the contact distance so as to lower the parasitic resistance depending on the contact distance and improve the performance of the MISFET.

20 Claims, 6 Drawing Sheets

SEMICONDUCTOR APPARATUS AND MANUFACTURING METHOD THEREFOR

BACKGROUND OF THE INVENTION

The present invention relates to a semiconductor apparatus and a manufacturing method therefor, and more particularly to the structure of a MISFET having a silicide compound of metal of a type having a high melting point in order to lower parasitic resistance and a method of forming the MISFET, which is used to manufacture, for example, a semiconductor memory.

To raise the density of integration of LSI devices and improve the performance of the same, devices such as MISFET have been formed more precisely. The above-mentioned trend of precisely forming the devices encounters adverse influences of resistance components which are parasitic on the MISFET.

To reduce the resistance which is parasitic on the MISFET device, silicide compounds of metal, such as Ti, Co, Ni and Pt, having a high melting point are formed on a gate electrode of the MISFET and an impurity-diffused layer (source and drain diffusion layer) for the drain and source of the same. Thus, reduction in the resistance components of the gate electrode, the impurity diffused layer for the source and drain and their contact portions has been attempted.

The conventional method of forming the MISFET has the step of forming a contact hole in an interlayer insulating film to form the contact portion of the source and drain diffusion layer. The insulating film on the side wall of the gate electrode which is used when the silicide compound is formed interrupts etching, causing the area of opening of the contact hole to be reduced. Hence it follows that the resistance of the contact portion is raised, causing a problem to arise in that the performance of the MISFET deteriorates.

When a contact hole is formed in a portion which is not interrupted by the insulating film on the side wall of the gate electrode, the distance (the contact distance) from the gate electrode to the contact portion of the source and drain diffusion layer is elongated. Thus, the parasitic resistance of the drain and source portion is raised, causing a problem to arise in that the performance of the MISFET deteriorates.

A process for forming the MISFET having the conventional salicide (Self Aligned Silicide) structure will now be described with reference to FIGS. 4A–4J such that an nMISFET is taken as an example.

As shown in FIG. 4A, a heat oxide film (an $SiO_2$) 102 having a thickness of, for example, 10 nm is formed on a p-type Si substrate 101 by heat oxidation. Then, polycrystal Si film 103 having a thickness of 200 nm is formed on the $SiO_2$ film 102 by an LP (Low Pressure)-CVD (Chemical Vapor Deposition) method. Then, an $SiO_2$ film 104 having a thickness of 200 nm is formed on the polycrystal Si film 103 by the LP-CVD method. Then, a photoengraving method is employed to form a resist pattern 105 on a region in which a device will be formed.

Then, as shown in FIG. 4B, the resist pattern 105 is used as a mask to perform anisotropic dry etching capable of realizing a selection ratio with respect to the polycrystal Si film 103. Thus, the $SiO_2$ film 104 is etched so that the resist pattern 105 is peeled such that the region of the $SiO_2$ film 106 is left.

Then, an $SiO_2$ film 106 is used as a mask to perform anisotropic dry etching capable of realizing a sufficiently high selection ratio with respect to the $SiO_2$ film 102 to etch the polycrystal Si film 103. Thus, the region of a polycrystal Si film 107 is left. Then, the $SiO_2$ film 102 is etched so that the region of an $SiO_2$ film 108 is left.

Then, as shown in FIG. 4C, anisotropic dry etching capable of realizing a sufficiently high selection ratio with respect to the $SiO_2$ film 106 is performed to etch the p-type Si substrate 101 by 0.5 μm. Thus, a STI (Shallow Trench Isolation) groove 109 is formed.

Then, as shown in FIG. 4D, the LP-CVD method is employed to deposit an $SiO_2$ film 110 having a thickness of 1.5 μm on the overall surface. Then, a CMP (Chemical Mechanical Polishing) method capable of realizing a sufficiently high selection ratio with respect to the polycrystal Si film 107 is employed to flatten the $SiO_2$ film 110.

Then, $NH_4F$ or dry etching is employed to etch the $SiO_2$ film 106 and the $SiO_2$ film 110 until the polycrystal Si film 107 is just exposed so that the embedded $SiO_2$ film 110 is left.

Then, as shown in FIG. 4E, isotropic dry etching capable of realizing a selection ratio with respect to the $SiO_2$ film 108 is performed to remove the polycrystal Si film 107 by etching. Then, the film stress of the embedded $SiO_2$ film 110 is reduced by performing heat treatment at, for example, 1000° C.

Then, the $SiO_2$ film 108 on the surface of the p-type Si substrate 101 is removed by etching using $NH_4F$, and then heat oxidation is performed at, for example, 800° C. so that an $SiO_2$ film (a sacrifice oxide film) 111 is formed.

Then, a p-well region 112 is formed by implanting B (boron) ions under conditions that accelerating voltage is 200 KeV and a quantity of dose is $8 \times 10^{12}$ $cm^{-2}$. To control the threshold of the nMISFET, boron ions are implanted under conditions that, for example, the accelerating voltage is 50 KeV and a quantity of dose is $1 \times 10^{13}$ $cm^{-2}$. To activate introduced impurities, heat treatment is performed at a predetermined temperature and duration.

Then, the $SiO_2$ film (the sacrifice oxide film) 111 on the surface of the p-type Si substrate 101 is removed, and then heat oxidation is performed at 750° C. so that a gate insulating film 113 having a thickness of 6 nm is formed, as shown in FIG. 4F.

Then, a gate electrode 116 is formed by depositing polycrystal Si by the LP-CVD method by a thickness of 300 nm. Then, the photograving method is employed to form a resist pattern 115 for forming a gate electrode. Anisotropic dry etching capable of realizing a sufficiently high selection ratio with respect to the $SiO_2$ film 110 is performed to etch the polycrystal Si film (the gate electrode 116 is left).

Then, as shown in FIG. 4G, a shallow diffusion layer (a shallow extension) 117 which will be formed into the source and drain layer of the nMISFET is formed by performing heat oxidation at 800° C. to form an $SiO_2$ film (a post-oxidation film) having a thickness of, for example, 5 nm. Then, implantation of As ions is performed under conditions that accelerating voltage is 35 KeV and a quantity of dose is $2 \times 10^{14}$ $cm^{-2}$. Then, heat treatment is performed for 30 seconds in a $N_2$ atmosphere at 1000° C.

Then, as shown in FIG. 4H, a deep diffusion layer (a deep extension) 119 which will be formed into the source and drain diffusion layer of the nMISFET is formed by, initially, forming an insulating film 118 on the side wall of the gate (a SiN side wall portion) made of, for example, SiN. At this time, the LP-CVD method is employed to deposit SiN on the overall surface by a thickness of 150 nm. Then, anisotropic etching capable of an etching selection ratio with respect to the $SiO_2$ film (the post-oxidation film) is performed to etch the SiN film (the insulating film 118 on the side wall of the gate is left).

Then, for example, As ions are implanted under conditions that the accelerating voltage is 60 KeV and a quantity of dose is $5 \times 10^{15}$ cm$^{-2}$. Then, heat treatment is performed for 30 seconds in a N$_2$ atmosphere at 1000° C. so that a deep diffusion layer 119 is obtained. Moreover, the gate electrode 116 is doped into an n+ type.

Then, the SiO$_2$ film on the gate electrode 116 of the nMISFET and the SiO$_2$ (113) on the deep diffusion layer 119 which will be formed into the source and drain diffusion layer are removed by using NH$_4$F.

To form, for example, a Ti salicide structure, Ti (titanium)/TiN (titanium nitride), which are metal materials each having a high melting point, are deposited by 30 nm/20 nm. Then, heat treatment is performed for 30 second in a N$_2$ atmosphere at 700° C. Mixed solution of sulfuric acid and hydrogen peroxide solution is used to remove Ti (including Ti on the SiN side wall 118) which has not reacted with Si. Thus, the SiN side wall 118 prevents occurrence of short circuit between the gate electrode 116 and the source and drain diffusion layer 119.

Then, heat treatment is performed for 30 second in a N$_2$ atmosphere at 800° C. Thus, as shown in FIG. 4I, a Ti-silicide-compound layer 120 having low resistance is formed on a portion of the deep diffusion layer 119 and the gate electrode 116.

Then, as shown in FIG. 4J, an SiO$_2$ film/BPSG film 121 serving as an interlayer insulating film is deposited by 100 nm/900 nm by the LP-CVD method. Then, the CMP method is employed to perform flattening. Then, the photograving method is employed to form a resist pattern for forming a contact hole. Then, anisotropic etching capable of realizing an etching selection ratio with respect to Si/SiN is performed to etch the SiO$_2$ film/BPSG film 121 so that the contact hole is opened.

Then, for example, Ti is sputtered so that a Ti film 127 is deposited on the overall surface. At this time, the depositing operation is performed such that the Ti film having a thickness of 10 nm is deposited in the bottom portion of the contact hole. Then, heat treatment is performed for 30 minutes in a N$_2$ atmosphere at, for example, 600° C. so that a TiN film is formed on the Ti film.

Then, W (tungsten) is plugged in the opened portion of the contact hole to form a contact plug 122 by depositing W on the overall surface by the CVD method by a thickness of 400 nm. Then, the CMP method is employed to remove W on the interlayer insulating film 121.

Then, AlCu (aluminum and copper) was deposited by 400 nm and Ti/TiN by 5 nm/60 nm. Then, the photograving method is employed to form a resist pattern (not shown). The resist pattern is used as a mask to perform anisotropic etching so as to form a circuit 123.

The process for forming the nMISFET having the conventional salicide structure encounters interruption of etching when the contact hole is formed in the interlayer insulating film 121 to form the contact portion of the source and drain diffusion layer. The interruption is caused from the insulating film 118 on the side wall of the gate which has been used to form the previous Ti salicide structure. As a result, the portion of the insulating film 118 on the side wall of the gate cannot be opened. As a result, the area of the opening portion of the contact hole is reduced. Thus, the area (the contact area) between the Ti-silicide-compound layer 120 on the diffusion layer 119 and the contact plug 122 is undesirably reduced. As a result, the contract resistance is raised undesirably.

If the contact area is maintained to reduce the contact resistance by forming the contact hole at a position at which etching is not interrupted by the insulating film 118 on the side wall of the gate, the distance (the contact distance) from the gate electrode 116 to the contact hole must be elongated. Therefore, the distance from the end of the diffusion layer below the gate electrode 116 to the contact portion is elongated excessively. Hence it follows that the parasitic resistance of the NMISFET is undesirably raised.

BRIEF SUMMARY OF THE INVENTION

As described above, the conventional method of forming the MISFET has the step of forming the contact hole for forming the contact portion of the source and drain diffusion layer. At this time, the area of opening of the contact hole is reduced owing to interruption caused by the insulating film on the side wall of the gate electrode. When the contact hole is formed at a position which is free from interruption caused from the insulating film on the side wall of the gate electrode, the contact distance is elongated. Thus, the parasitic resistance depending on the contact distance is raised. Thus, the re arises a problem in that the performance of the MISFET deteriorates.

To solve the above-mentioned problems, an object of the present invention is to provide a semiconductor apparatus and a manufacturing method therefor with which the contact area of the source and drain diffusion layer can be maintained without elongation of the contact distance to reduce the contact resistance so as to reduce the parasitic resistance depending on the contact distance and improve the performance of the MISFET.

To achieve the foregoing object, according to a first aspect of the present invention, there is provided a semiconductor apparatus comprising: an impurity diffusion layer of a drain and source of a MISFET selectively formed on the surface of a semiconductor substrate or a semiconductor layer; a gate electrode formed on a channel region between the drain and the source through a gate insulating film; a side-wall insulating film formed on the side wall of the gate electrode; an interlayer insulating film formed to cover the gate electrode and the side-wall insulating film and having an opened portion including a side-portion removed region obtained by removing a portion of the side portion of the side-wall insulating film on an impurity diffusion layer for the drain and source; a silicide compound layer formed on the impurity diffusion layer for the drain and source, the silicide compound layer being formed on the bottom surface of the opening of the interlayer insulating film corresponding to the side-portion removed region; and a conductor formed in the opening and made contact with the silicide compound layer.

In the semiconductor apparatus according to the first aspect of the present invention, the side-wall insulating film may be made of SiN or SiO$_2$.

In the semiconductor apparatus according to the first aspect of the present invention, another silicide compound layer different from the silicide compound layer may be formed on the impurity diffusion layer for the drain and source, and the other silicide compound layer may be formed in a portion other than a bottom surface of the opening corresponding to the side-portion removed region. The silicide compound layer formed on the bottom surface of the opening corresponding to the side-portion removed region and the other silicide compound layer formed in the portion other than the bottom surface of the opening corresponding to the side-portion removed region may be silicide compound layers made of the same type metal. The silicide compound layer formed on the bottom surface of the opening corresponding to the side-portion removed region and the other silicide compound layer formed in the portion other than the bottom surface of the opening corresponding to the side-portion removed region may be silicide compound layers made of different type metals. The silicide compound layer formed on the bottom surface of the opening corresponding to the side-portion removed region may have a thickness smaller than that of the other silicide compound layer formed in the portion other than the bottom surface of the opening corresponding to the side-portion removed region. The side-wall insulating film may be made of SiN or $SiO_2$ According to a second aspect of the present invention, there is provided a method of manufacturing a semiconductor apparatus, comprising the steps of: forming a gate electrode of a MISFET on a semiconductor substrate or a semiconductor layer through a gate insulating film; selectively forming an impurity diffusion layer for the drain and source of a MISFET on a surface layer of the semiconductor substrate or the semiconductor layer by using the gate electrode as a mask; forming a side-wall insulating film on the side wall of the gate electrode; forming a first silicide compound layer on the gate electrode and the impurity diffusion layer for the drain and source; forming an interlayer insulating film on the overall surface of the semiconductor substrate or the semiconductor layer; forming an opening in the interlayer insulating film on the impurity diffusion layer for the drain and source and forming a contact hole by removing a portion of the side portion of the side-wall insulating film; and forming a second silicide compound layer on the impurity diffusion layer for the drain and source on the bottom surface of the contact hole from which a portion of the side portion of the side-wall insulating film has been removed.

In the method of manufacturing a semiconductor apparatus, according to the second aspect of the present invention, the second silicide compound layer may have a thickness smaller than that of the first silicide compound layer.

In the method of manufacturing a semiconductor apparatus, according to the second aspect of the present invention, the first silicide compound layer and the second silicide compound layer may be silicide compound layers made of the same type metal. The second silicide compound layer may have a thickness smaller than that of the first silicide compound layer.

In the method of manufacturing a semiconductor apparatus, according to the second aspect of the present invention, the first silicide compound layer and the second silicide compound layer may be silicide compound layers made of different type metals. The second silicide compound layer may have a thickness smaller than that of the first silicide compound layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
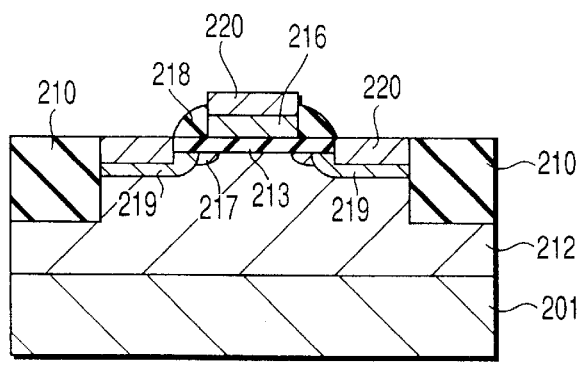
FIGS. 1A to 1E are cross sectional views showing the structure of a semiconductor in each step for forming an nMISFET having a Ti silicide structure according to a first embodiment of the present invention.

Referring to the drawings, embodiments of the present invention will now be described.

<First Embodiment of Method of Forming MISFET>

FIGS. 1A to 1E show the structure of a semiconductor in each step of forming an nMISFET having a Ti silicide structure according to a first embodiment.

Steps similarly to those shown in FIGS. 4A–4I are performed so that a Ti silicide structure of nMISFET is formed as shown in FIG. 1A.

Reference numeral 201 represents a Si substrate, 210 represents an $SiO_2$ film embedded in a STI region (groove), 212 represents a p-well region, 213 represents an $SiO_2$ film (a gate insulating film), 216 represents a gate electrode formed by doping polycrystal Si to n+ type, 217 represents an n− type shallow diffusion layer, 218 represents a SiN side wall portion, 219 represents an n+ deep diffusion layer and 220 represents a Ti silicide compound layer.

Figure 1B:
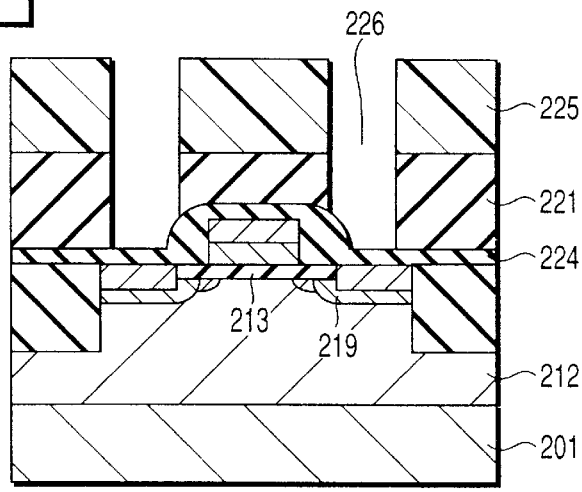

Then, as shown in FIG. 1B, a LP-CVD method or a PVD method is employed to deposit SiN 224 to have a thickness of 40 nm. Then, the LP-CVD method is employed to deposit $Sio_2$/BPSG which serves as an interlayer insulating film 221 to have thicknesses of 100 nm/900 nm. Then, a CMP method is employed to perform flattening the surface.

Then, a photograving method is employed to form a resist pattern 225 for forming a contact hole. Then, anisotropic etching capable of realizing an etching selection ratio with respect to the SiN 224 is performed to form an opening 226 in the interlayer insulating film 221.

Then, anisotropic etching capable of realizing an etching selection ratio with respect to the Ti silicide compound layer 220 and the Si substrate 201 is employed to remove the SiN 224 in the bottom portion of the opening 226 so that a contact hole is formed.

At this time, the side portion of the SiN side-wall portion 218 and the gate insulating film 213 below the SiN side-wall portion 218 are also simultaneously removed by etching (see FIG. 1C). Thus, a region of the deep diffusion layer 219 for the drain and source in which the Ti silicide compound layer 220 has not been formed is exposed in the bottom portion of the opening 226, the region being a region of the SiN side-wall portion 218 from which the side portion has been removed. The Ti silicide compound layer 220 formed previously when the Ti silicide structure has been formed is exposed in the outside portion below the region of the SiN side-wall portion 218 from which the side portion has been removed.

Figure 1C:
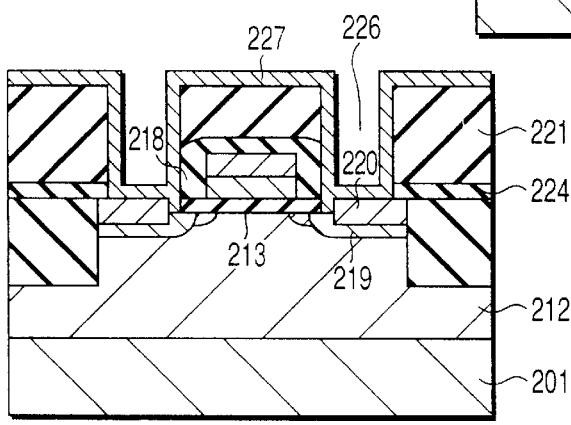

Then, as shown in FIG. 1C, sputtering of, for example, Ti, is performed to deposit a Ti film 227 on the overall surface. At this time, the sputtering operation is performed in such a manner that the Ti film 227 having a thickness of 10 nm is deposited in the bottom portion of the contact hole.

Then, heat treatment is performed for 30 minutes in a $N_2$ atmosphere at, for example, 600° C. so that TiN is formed on the surface of the Ti film 227. In the foregoing case, TiN formed on the surface of the Ti film 227 in the bottom portion of the contact hole serves as a barrier layer for protecting a portion of the Ti film 227 below a metal layer formed on the TiN layer in a latter process.

Figure 1D:
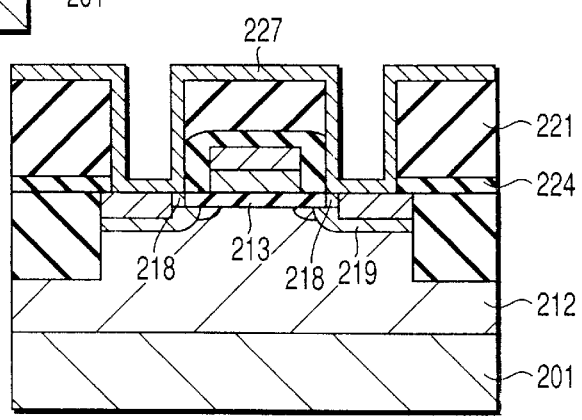

As a result of the heat treatment, the Ti silicide compound layer 228 is formed on the deep diffusion layer 219 below the region of the SiN side-wall portion 218 from which the side portion has been removed, as shown in FIG. 1D.

At this time, control is performed in such a manner that the thickness of the Ti silicide compound layer 228, which is formed below the region of the SiN side-wall portion 118 from which the side portion has been removed, is smaller than the thickness of each of the shallow diffusion layer 217 and the deep diffusion layer 219 which have been formed. Moreover, the thickness of the Ti silicide compound layer 228 is smaller than the thickness of the Ti silicide compound layer 220 which is formed on the outside of a portion below the region of the SiN side-wall portion 218 from which the side portion has been removed when the Ti silicide structure has been formed.

As a result, the formed Ti silicide compound layer 228 does not protrude over the joint portion among the deep diffusion layer 219, the shallow diffusion layer 217 and the p-well region 212. Hence it follows that a satisfactory MISFET characteristic free from leakage from the joint portion can be obtained.

Figure 1E:
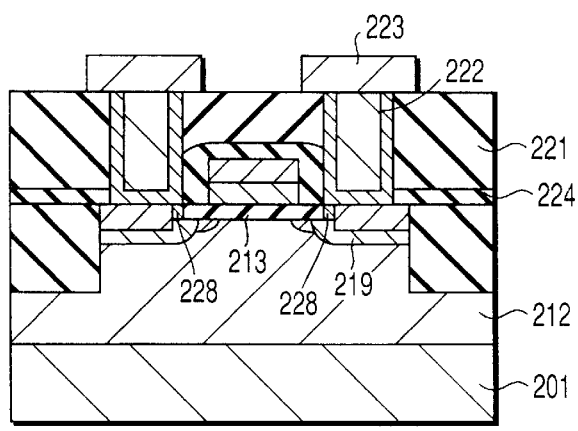

Then, as shown in FIG. 1E, W is plugged in the opening 226 to form a contact plug 222 such that W is deposited on the overall surface by the CVD method to have a thickness of 400 nm. Then, the CMP method is employed to remove unnecessary W and Ti/TiN on the interlayer insulating film 221.

Then, AlCu is deposited on the overall surface to have a thickness of 400 nm and Ti/TiN is deposited on the overall surface to have thicknesses of 5 nm/60 nm. Then, the photograving method is employed to form a resist pattern (not shown). The resist pattern is used as a mask to perform anisotropic etching to form a circuit 223.

The foregoing method of forming the nMISFET according to the first embodiment is summarized that the SiN side-wall portion 218 is formed on the MISFET gate electrode, followed by using the SiN side-wall portion 218 to form the Ti silicide structure.

Then, SiN 224 is deposited on the overall surface, and then the flattened interlayer insulating film 221 is formed on the SiN 224. The resist pattern 225 for forming the contact hole is used as a mask and the SiN 224 is used as a stopper to selectively perform anisotropic etching. Thus, a contact-hole opening 226 is formed on the deep diffusion layer 219 for the drain and source.

At this time, the surface of the SiN side-wall portion 218 which has been used to form the Ti silicide structure is as well as selectively etched. Also the side portion of the SiN side-wall portion 218 is removed. Thus, a region of the deep diffusion layer 219, in which the Ti silicide compound layer 220 has not been formed, is exposed in the bottom portion of the contact-hole opening 226, the region being exposed below the region of the SiN side-wall portion 218 from which the side portion has been removed.

Then, a Ti silicide compound layer 228 having a thickness smaller than that of the Ti silicide compound layer 220 formed on the outside of the portion below the region of the SiN side-wall portion 118 from which the side portion has been removed is formed also in the region of the surface of the bottom of the contact-hole opening 226 in which the Ti silicide compound layer 220 has not been formed.

That is, the process for forming the nMISFET according to the first embodiment is structured such that the contact hole is formed in the interlayer insulating film 221 for forming the contact portion of the source and drain diffusion layer. At this time, the portion of the side portion of the SiN side-wall portion 218 which has been used to form the Ti silicide structure is simultaneously removed by etching so that the Ti silicide compound layer 228 is formed in the bottom portion of the contact hole.

Therefore, the process for forming the nMISFET according to the first embodiment and the nMISFET formed by the method are free from the necessity of sufficiently elongating the distance (the contact distance) from the gate electrode 216 to the contact hole. That is, the distance from the end of the diffusion layer below the gate electrode 216 to the contact portion is not required to be sufficiently long. If the distance is not considerably long, a sufficiently large area of the contact portion (the contact area) between the Ti silicide compound layers 220 and 228 on the diffusion layer 219 for the source and drain and the contact plug 222 can be maintained to lower the contact resistance.

Therefore, the gate and contact spaces can be reduced (the device including the contact portion can precisely be formed). Hence it follows that the parasitic resistance component depending on the contact distance can be reduced. As a result, the original performance of the nMISFET improved owing to the precise formation can be obtained.

The foregoing process for forming the nMISFET according to the first embodiment is structured such that the Ti silicide compound layer 228 is formed in the bottom portion of the contact hole such that the thickness of the Ti silicide compound layer 228 is smaller than the thickness of the Ti silicide compound layer 220 formed previously when the Ti silicide structure has been formed.

Therefore, the process for forming the nMISFET according to the first embodiment and the nMISFET formed by the method can prevent protrusion of the Ti silicide compound layer 228 over the joined portion between the diffusion layers 219 and 217 for the source and drain and the p-well region 212. Thus, a satisfactory characteristic of the MISFET free from the problem of leakage from the joined portion can be realized.

The process for forming the nMISFET according to the first embodiment has the steps of forming the Ti silicide structure; depositing the SiN 224 on the overall surface; forming the interlayer insulating film 221 on the SiN 224 and selectively performing anisotropic etching by using the SiN 224 as the stopper so that the opening 226 for the contact hole is formed. At this time, the SiN 224 is used as the stopper so that interruption of the etching of the interlayer insulating film 221 is permitted once during the process. Therefore, if the opening 226 for the contact hole is deviated onto the STI of the device isolation region owing to deviation of the mask pattern, $SiO_2$ 210 in the STI is not substantially etched. Therefore, the problem of the leakage from the joint owing to etching of the $SiO_2$ 210 in the STI can be prevented.

<Second Embodiment of Method of Forming nMISFET> (FIGS. 2A–2E)

The difference of the second embodiment from the first embodiment will now be described. In the second embodiment, deposition of SiN on the overall surface is not performed (similarly to the conventional structure) after the nMISFET Ti silicide structure has been formed. Then, the interlayer insulating film is formed, and then the interlayer insulating film is flattened. The resist pattern for forming the contact hole is used as the mask to open the contact hole. Then, anisotropic etching capable of realizing a selection ratio with respect to the Si substrate and the silicide compound is performed to selectively and simultaneously etch the surface of the SiN Side wall portion. Thus, the side portion of the SiN side wall portion and the gate insulating film below the side portion of the side wall portion are removed. The other structures are the same as those of the first embodiment.

Figure 2A:
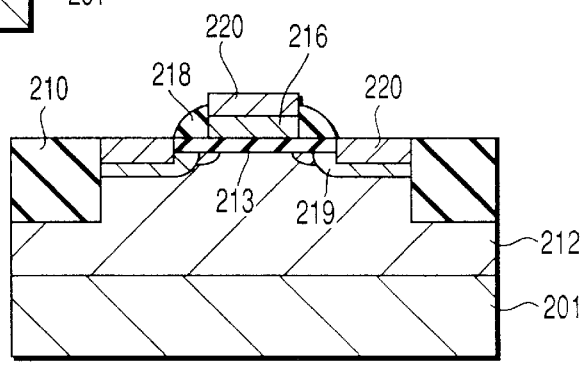
FIGS. 2A to 2E are cross sectional views showing the structure of a semiconductor in each step for forming an nMISFET having a Ti silicide structure according to a second embodiment of the present invention.

That is, the processes similar to those shown in FIGS. 4A to 4I are performed so that an nMISFET Ti silicide structure is formed, as shown in FIG. 2A.

Referring to FIG. 2A, reference numeral 201 represents a Si substrate, 210 represents an $SiO_2$ film formed in a STI region (a groove), 212 represents a p-well region, 213 represents an $SiO_2$ film (a gate insulating film), 216 represents a gate electrode formed by doping polycrystal Si into the n+ type, 217 represents an n– type shallow diffusion layer, 218 represents a SiN side wall portion, 219 represents an n+ type deep diffusion layer and 220 represents a Ti silicide compound layer 220.

Figure 2B:
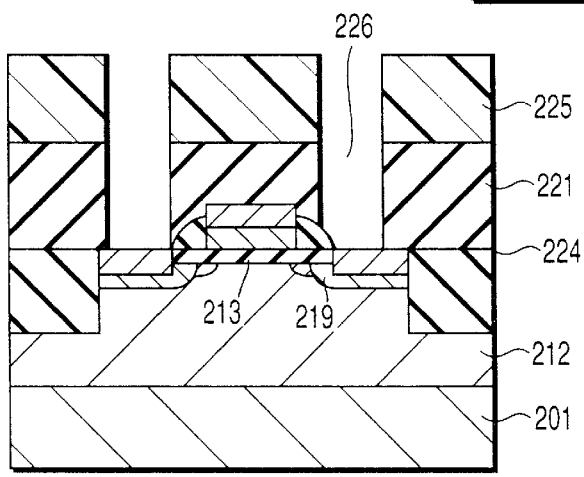

As shown in FIG. 2B, the LP-CVD method is employed to deposit $SiO_2$/BPSG serving as an interlayer insulating film 221 on the overall surface to have thicknesses of 100 nm/900 nm. Then, the CMP method is employed to flatten the surface.

Then, the photograving method is employed to form a resist pattern 225 for forming a contact hole. Then, anisotropic etching is performed to form an opening 226 in the interlayer insulating film 221.

Then, anisotropic etching capable of realizing a selection rate with respect to the Si substrate 201 and the Ti silicide compound layer 220 is performed to selectively and simultaneously etch the surface of the SiN side wall portion 218. Thus, the side portion of the SiN side wall portion 218 and the gate insulating film 213 below the SiN side wall portion 218 are removed (see FIG. 2C). Hence it follows that a region of the deep diffusion layer 219 for the drain and source in which the Ti silicide compound layer 220 has not been formed is exposed in the bottom portion of the opening 226, the region being exposed below the region of the SiN side wall portion 218 from which the side portion has been removed. Moreover, the Ti silicide compound layer 220 previously formed when the Ti silicide structure has been formed is exposed on the outside of a portion below the region of the SiN side wall portion 218 from which the side portion has been removed.

Figure 2C:
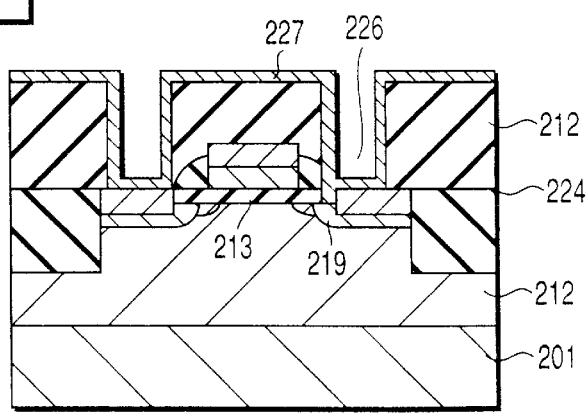

Then, as shown in FIG. 2C, sputtering of, for example, Ti is performed to deposit a Ti film 227 on the overall surface. At this time, the sputtering process is performed in such a manner that the Ti film 227 is deposited in the bottom portion of the opening 226 to have a thickness of 10 nm.

Then, heat treatment is performed for 30 minutes in a $N_2$ atmosphere at, for example, 600° C. so that a TiN film is formed on the surface of the Ti film 227. In the foregoing case, the TiN film formed on the surface of the Ti film 227 in the bottom portion of the opening 226 serves as a barrier layer for protecting the Ti film 227 which is formed below a metal portion which will be formed on the TiN film in the latter process.

Figure 2D:
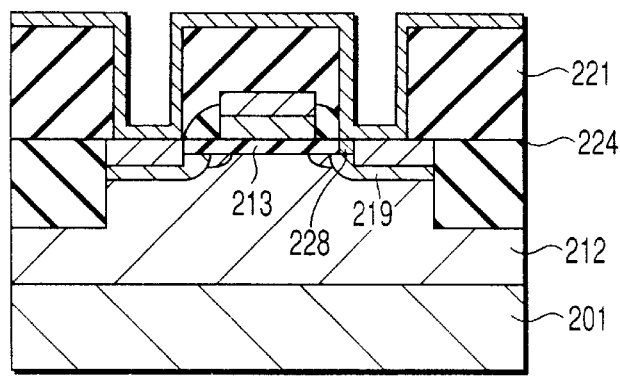

As a result of the heat treatment, the Ti silicide compound layer 228 is formed on the deep diffusion layer 219 below the region of the SiN side-wall portion 218 from which the side portion has been removed, as shown in FIG. 2D.

At this time, control is performed in such a manner that the thickness of the Ti silicide compound layer 228, which is formed below the region of the SiN side-wall portion 118 from which the side portion has been removed, is smaller than the thickness of each of the shallow diffusion layer 217 and the deep diffusion layer 219 which have been formed. Moreover, the thickness of the Ti silicide compound layer 228 is smaller than the thickness of the Ti silicide compound layer 220 which is formed on the outside of a portion below the region of the SiN side-wall portion 218 from which the side portion has been removed when the Ti silicide structure has been formed.

As a result, the formed Ti silicide compound layer 228 does not protrude over the joint portion among the deep diffusion layer 219, the shallow diffusion layer 217 and the p-well region 212. Hence it follows that a satisfactory MISFET characteristic free from leakage from the joint portion can be obtained.

Figure 2E:
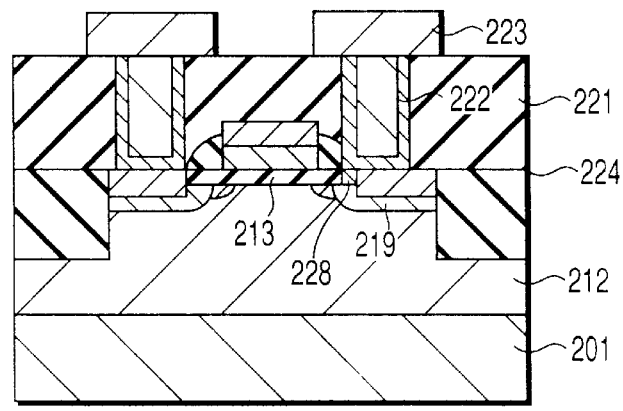

Then, as shown in FIG. 2E, W is plugged in the opening of the contact hole to form a contact plug 222 such that W is deposited on the overall surface by the CVD method to have a thickness of 400 nm. Then, the CMP method is employed to remove unnecessary W and Ti/TiN on the interlayer insulating film 221.

Then, AlCu is deposited on the overall surface to have a thickness of 400 nm and Ti/TiN is deposited on the overall surface to have thicknesses of 5 nm/60 nm. Then, the photograving method is employed to form a resist, pattern (not shown). The resist pattern is used as a mask to perform anisotropic etching to form a circuit 223.

The foregoing method of forming the nMISFET according to the second embodiment and the nMISFET formed by the method are free from the necessity of sufficiently elongating the contact distance similarly to the method of forming the nMISFET according to the first embodiment and the nMISFET formed by the method. Thus, a sufficiently large area of opening of the opening 226 can be maintained so that a sufficiently large area of the contact portion of the source and drain is maintained. Thus, the contact resistance can be reduced.

When the Ti silicide compound layer 228 is formed in the bottom portion of the opening 226, the thickness of the Ti silicide compound layer 228 is made to be smaller than the thickness of the Ti silicide compound layer 220 which has been formed when the Ti silicide structure is formed previously. Thus, protrusion of the Ti silicide compound layer 228 over the joint portion among the diffusion layers 219 and 217 for the source and drain and the p-well region 212 can be prevented. Thus, a satisfactory MISFET characteristic free from a problem of leakage from the joint portion can be obtained.

Although the SiN side wall portion 218 is suitable when the Ti silicide structure is formed, the SiN side wall portion 218 sometimes reacts with metal having a high melting point other than Ti when a silicide compound of metal having a high melting point other than Ti is formed. In the foregoing case, it is preferable that an $SiO_2$ side wall portion is formed as substitute for the SiN side wall portion 218. Third and fourth embodiments with which the $SiO_2$ side wall portion is used to form the silicide structure will now be described.

<Third Embodiment of Method of Forming nMISFET>

The third embodiment is different from the first embodiment with reference to FIGS. 1A–1E. That is, in the third embodiment, (1) $SiO_2$ is employed to form the side wall portion (the $SiO_2$ side wall portion) of the gate electrode;

and (2) anisotropic etching capable of realizing a selection ratio with respect to Si, SiO$_2$ film and the silicide compound is performed after the opening 226 for the contact hole has been formed in the interlayer insulating film 221 so as to selectively remove the SiN 224 in the bottom of the opening, followed by selectively etching the surface of the SiO$_2$ side wall portion by anisotropic etching to remove a portion of the SiO$_2$ side portion and the gate insulating film below the SiO$_2$ side portion. The other portions are the same as those of the first embodiment.

The process for forming the nMISFET according to the third embodiment and the nMISFET formed by the method are also, similarly to the process for forming the nMISFET according to the first embodiment and the nMISFET formed by the method, free from the necessity of considerably elongating the contact distance. With the third embodiment, a sufficiently large area of opening of the contact hole can be maintained so that a satisfactory large area of the contact portion of the source and drain is maintained. Thus, the contact resistance can be lowered.

When the Ti silicide compound layer 228 is formed in the bottom portion of the contact hole, the thickness of the Ti silicide compound layer 228 is made to be smaller than the thickness of the Ti silicide compound layer 220 previously formed when the Ti silicide structure has been formed. Thus, protrusion of the Ti silicide compound layer 228 from the joint portion among the diffusion layers 219 and 217 for the source and drain and the p-well region 212 can be prevented. Hence it follows that a satisfactory MISFET characteristic free from the problem of leakage from the joint portion can be obtained.

After the silicide structure has been formed, the SiN 224 is deposited on the overall surface. Then, the interlayer insulating film 221 is formed on the SiN 224. The SiN 224 is used as a stopper to selectively perform anisotropic etching to form the opening 226 for the contact hole. If deviation of the mask pattern has caused the opening 226 for the contact hole to be deviated to the portion on the STI in the device isolation region, the SiO$_2$ film 210 in the STI is not substantially etched. Therefore, the problem of leakage from the joint portion caused from etching of the SiO$_2$ film 210 in the STI can be prevented.

<Fourth Embodiment of Method of Forming nMISFET>

The fourth embodiment is different from the second embodiment with reference to FIGS. 2A to 2E. In the fourth embodiment, (1) SiO$_2$ is used to form the side wall portion (the SiO$_2$ side wall portion) of the gate electrode; and (2) when the opening 226 for the contact hole is formed in the interlayer insulating film 221, anisotropic etching capable of realizing a selection ratio with respect to Si and silicide compound is performed to selectively etch the surface of the SiO$_2$ side wall portion so as to remove a portion of the side portion of the SiO$_2$ side wall portion and the gate insulating film below the SiO$_2$ side wall portion. The other structures are the same as those of the second embodiment.

Also the process for forming the nMISFET according to the fourth embodiment and the nMISFET formed by the method are not required to considerably elongating the contact distance similarly to the process for forming the nMISFET according to the second embodiment and the nMISFET formed by the method. With the fourth embodiment, a sufficiently large area of opening of the contact hole can be maintained to maintain a satisfactory large contact portion of the source and drain. As a result, the contact resistance can be lowered.

When the Ti silicide compound layer 228 is formed in the bottom portion of the contact hole, the thickness of the Ti silicide compound layer 228 is made to be smaller than the thickness of the Ti silicide compound layer 220 previously formed when the Ti silicide structure has been formed. Thus, protrusion of the Ti silicide compound layer 228 over the joint portion among the diffusion layers 219 and 217 for the source and drain and the p-well region 212 can be prevented. Hence it follows that a satisfactory MISFET characteristic free from the problem of leakage from the joint portion can be obtained.

<Fifth Embodiment of Method of Forming nMISFET>

In the first to fourth embodiments, the Ti silicide structure is formed. Another silicide structure of metal, such as Co, Pt or Ni, other than Ti can be formed.

In the foregoing case, the Ti silicide compound layer 220 on the deep diffusion layer 219 for the source and drain on the gate electrode 216 and the Ti silicide compound layer 228 on the deep diffusion layer 219 below the removed region of the gate side-wall insulating film may be constituted by silicide compounds made of the same metal or silicide compounds made of different metal materials.

The fifth embodiment is different from any one of first to fourth embodiments in (1) a silicide compound layer 220 made of metal having a high melting point other than Ti is formed on the gate electrode 216 and the deep diffusion layer 219 for the drain and source; and (2) a silicide compound layer 228 made of metal having a high melting point other than Ti is formed on the deep diffusion layer 219 for the drain and source below the removed region of the SiN side wall insulating film 218. The other structures are the same as any one of the foregoing embodiments.

In the foregoing case, the silicide compound layer 228 which is formed below the removed region of the SiN side wall portion 218 is formed to be shallower than the silicide compound layer 220 on the deep diffusion layer 219 formed previously similarly to the first to fourth embodiments. Thus, leakage from the joint portion can be prevented to most effectively reduce parasitic resistance of the nMISFET caused from the silicide.

Figure 3:
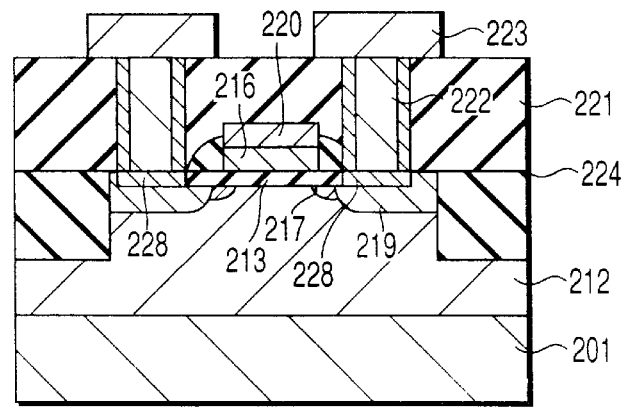
FIG. 3 is a cross sectional view showing the structure of a semiconductor in each step for forming an nMISIFET having a Ti silicide structure according to a sixth embodiment of the present invention.
Figure 4A:
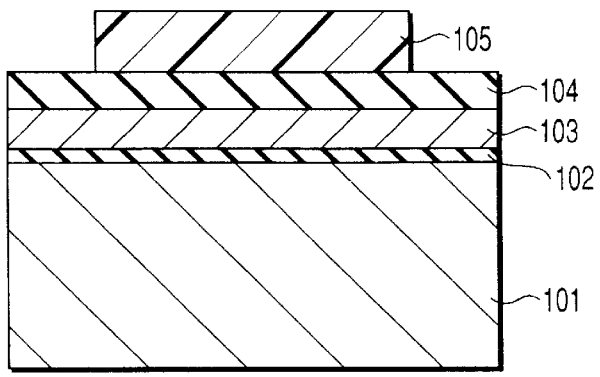
FIGS. 4A to 4J are cross sectional views showing the structure of a semiconductor in each step for forming a conventional nMISFET having a Ti silicide structure.
Figure 4B:
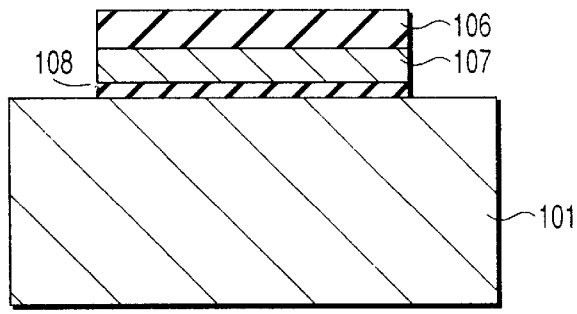
Figure 4C:
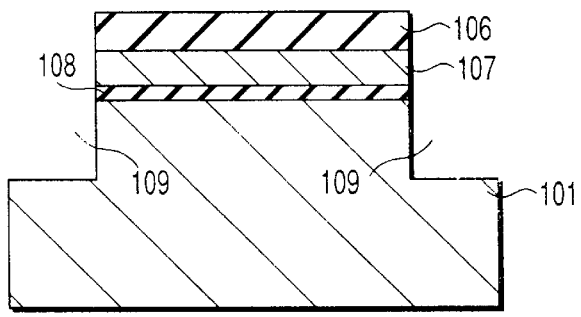
Figure 4D:
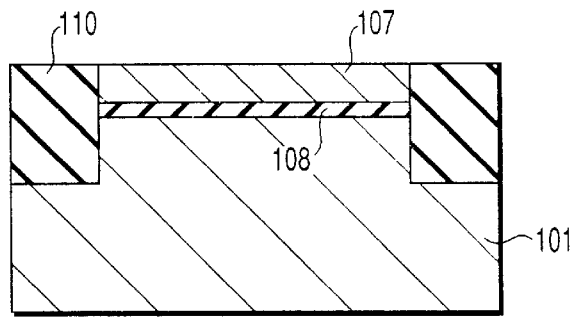
Figure 4E:
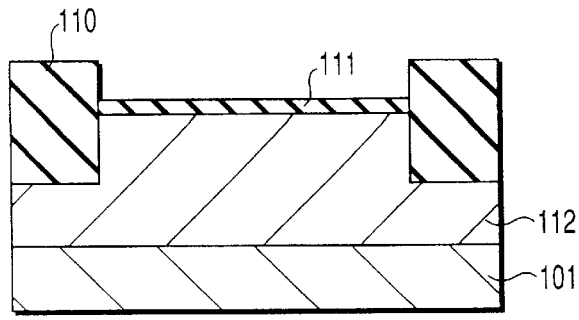
Figure 4F:
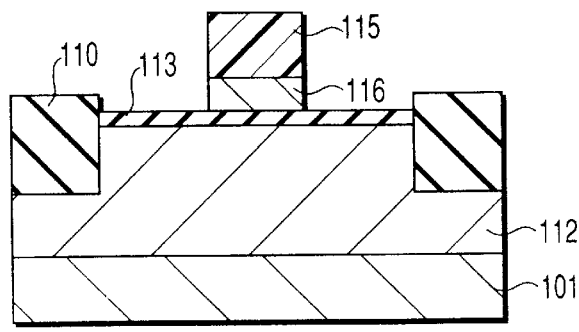
Figure 4G:
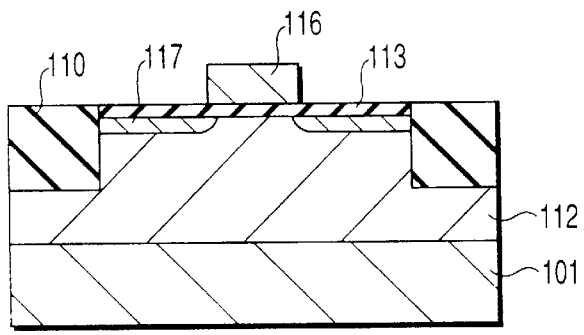
Figure 4H:
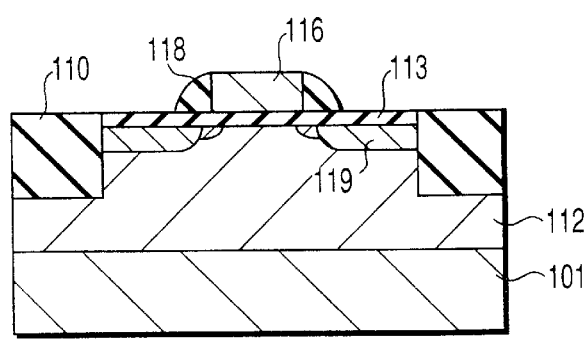
Figure 4I:
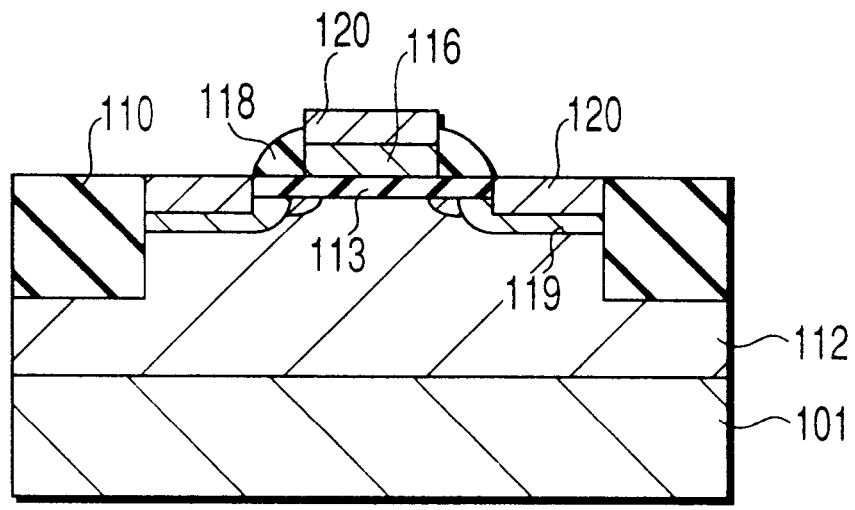
Figure 4J:
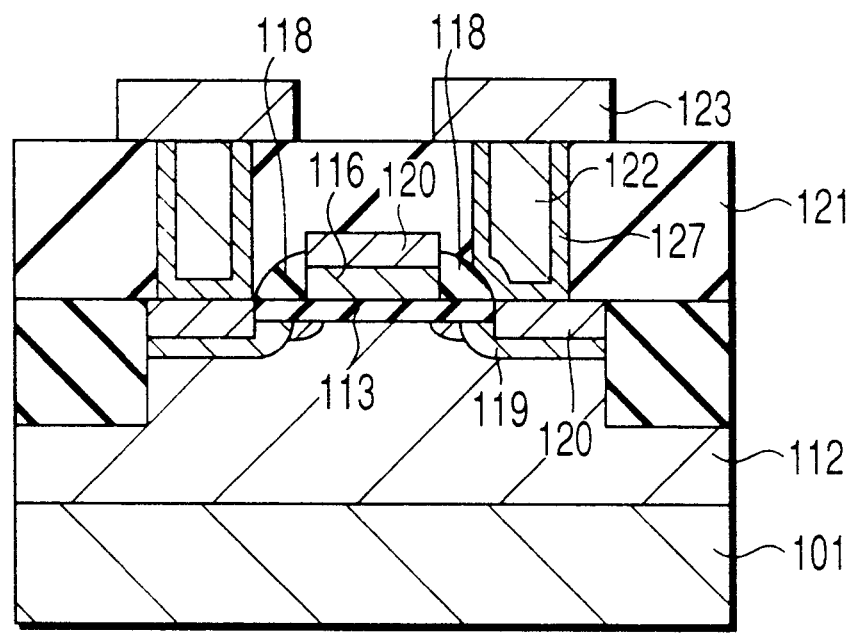

<Sixth Embodiment of Method of Forming nMISFET> (FIG. 3)

In the first to fifth embodiments, the silicide compound layer 220 having the silicide structure is formed on the deep diffusion layer 219 for the source and drain. Also in a case in which the silicide compound layer 220 having the silicide structure is not formed on the deep diffusion layer 219 for the source and drain, a portion of the side portion of the gate side-wall insulating film 218 is removed, as shown in FIG. 3. Moreover, silicide compound layer 228 made of metal having a high melting point is formed on the deep diffusion layer 219 in the bottom portion of the contact hole. Thus, the parasitic resistance of the nMISFET can be lowered.

Another structure may be employed in which the silicide compound layer 220 having the silicide structure is not formed on the gate electrode 216 and the gate electrode 216 is formed into a poly-metal structure having the silicide structure.

<Method of Forming PMISFET>

In the first to sixth embodiments, the process for forming the nMISFET has been described. As a matter of course, a CMOS process may be performed such that a process similar to the foregoing nMISFET process is employed to process a PMISFET region to obtain a similar effect.

As described above, according to the present invention, the semiconductor apparatus and the manufacturing method therefor can be provided which is free from the necessity of elongating the contact distance to maintain a sufficiently large contact area of the source and drain diffusion layer so as to lower the contact resistance. Thus, the parasitic resistance depending on the contact distance can be lowered so that the performance of the MISFET is improved.

That is, the semiconductor apparatus according to the present invention has the structure that the contact area on the diffusion layer is enlarged to reach a portion below the removed region which is a portion of the gate side-wall insulating film and the silicide compound layer is formed on the diffusion layer. Therefore, the contact resistance and the parasitic resistance of the source and drain can be lowered.

The portion below the removed region which is a portion of the gate side wall insulating film is the region in which the shallow diffusion layer is formed to obtain the short-channel effect of the MISFET and improve the diffusion resistance. Since the diffusion layer is a shallow layer as compared with the deep diffusion layer, formation of the shallow silicide compound layer enables leakage from the joint portion can be prevented.

When the present invention is structured such that the gate side-wall insulating film is made of $SiO_2$ or SiN, reaction with metal having a high melting point is inhibited when the silicide compound is formed. Therefore, a silicide compound can selectively be formed.

The method of manufacturing the semiconductor apparatus according to the present invention has the structure that the contact area on the diffusion layer is enlarged to reach the removed region which is a portion of the gate side-wall insulating film and the silicide compound layer is formed on the diffusion layer. Thus, a semiconductor apparatus can be manufactured with which the contact resistance and the parasitic resistance of the source and drain can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor apparatus comprising:
   an impurity diffusion layer of a drain and source of a MISFET selectively formed on the surface of a semiconductor substrate or a semiconductor layer;
   a gate electrode formed on a channel region between the drain and the source through a gate insulating film;
   a side-wall insulating film formed on the side wall of the gate electrode;
   an interlayer insulating film formed to cover the gate electrode and the side-wall insulating film and having an opened portion including a side-portion removed region obtained by removing a portion of the side portion of the side-wall insulating film on an impurity diffusion layer for the drain and source;
   a silicide compound layer formed on the impurity diffusion layer for the drain and source, the silicide compound layer being formed on the bottom surface of the opening of the interlayer insulating film corresponding to the side-portion removed region; and
   a conductor formed in the opening and made contact with the silicide compound layer.

2. A semiconductor apparatus according to claim 1, wherein another silicide compound layer different from the silicide compound layer is formed on the impurity diffusion layer for the drain and source, the other silicide compound layer being formed in a portion other than a bottom surface of the opening corresponding to the side-portion removed region.

3. A semiconductor apparatus according to claim 2, wherein the silicide compound layer formed on the bottom surface of the opening corresponding to the side-portion removed region and the other silicide compound layer formed in the portion other than the bottom surface of the opening corresponding to the side-portion removed region are silicide compound layers made of the same type metal.

4. A semiconductor apparatus according to claim 2, wherein the silicide compound layer formed on the bottom surface of the opening corresponding to the side-portion removed region and the other silicide compound layer formed in the portion other than the bottom surface of the opening corresponding to the side-portion removed region are silicide compound layers made of different type metals.

5. A semiconductor apparatus according to claim 2, wherein the silicide compound layer formed on the bottom surface of the opening corresponding to the side-portion removed region has a thickness smaller than that of the other silicide compound layer formed in the portion other than the bottom surface of the opening corresponding to the side-portion removed region.

6. A semiconductor apparatus according to claim 3, wherein the silicide compound layer formed on the bottom surface of the opening corresponding to the side-portion removed region has a thickness smaller than that of the other silicide compound layer formed in the portion other than the bottom surface of the opening corresponding to the side-portion removed region.

7. A semiconductor apparatus according to claim 4, wherein the silicide compound layer formed on the bottom surface of the opening corresponding to the side-portion removed region has a thickness smaller than that of the other silicide compound layer formed in the portion other than the bottom surface of the opening corresponding to the side-portion removed region.

8. A semiconductor apparatus according to claim 1, wherein the side-wall insulating film is made of SiN or $SiO_2$.

9. A semiconductor apparatus according to claim 2, wherein the side-wall insulating film is made of SiN or $SiO_2$.

10. A semiconductor apparatus according to claim 3, wherein the side-wall insulating film is made of SiN or $SiO_2$.

11. A semiconductor apparatus according to claim 4, wherein the side-wall insulating film is made of SiN or $SiO_2$.

12. A semiconductor apparatus according to claim 5, wherein the side-wall insulating film is made of SiN or $SiO_2$.

13. A semiconductor apparatus according to claim 6, wherein the side-wall insulating film is made of SiN or $SiO_2$.

14. A semiconductor apparatus according to claim 7, wherein the side-wall insulating film is made of SiN or $SiO_2$.

15. A method of manufacturing a semiconductor apparatus, comprising the steps of:
   forming a gate electrode of a MISFET on a semiconductor substrate or a semiconductor layer through a gate insulating film;
   selectively forming an impurity diffusion layer for the drain and source of a MISFET on a surface layer of the semiconductor substrate or the semiconductor layer by using the gate electrode as a mask;
   forming a side-wall insulating film on the side wall of the gate electrode;
   forming a first silicide compound layer on the gate electrode and the impurity diffusion layer for the drain and source;
   forming an interlayer insulating film on the overall surface of the semiconductor substrate or the semiconductor layer;

forming an opening in the interlayer insulating film on the impurity diffusion layer for the drain and source and forming a contact hole by removing a portion of the side portion of the side-wall insulating film; and forming a second silicide compound layer on the impurity diffusion layer for the drain and source on the bottom surface of the contact hole from which a portion of the side portion of the side-wall insulating film has been removed.

16. A method of manufacturing a semiconductor apparatus according to claim 15, wherein the first silicide compound layer and the second silicide compound layer are silicide compound layers made of the same type metal.

17. A method of manufacturing a semiconductor apparatus according to claim 15, wherein the first silicide compound layer and the second silicide compound layer are silicide compound layers made of different type metals.

18. A method of manufacturing a semiconductor apparatus according to claim 15, wherein the second silicide compound layer has a thickness smaller than that of the first silicide compound layer.

19. A method of manufacturing a semiconductor apparatus according to claim 16, wherein the second silicide compound layer has a thickness smaller than that of the first silicide compound layer.

20. A method of manufacturing a semiconductor apparatus according to claim 17, wherein the second silicide compound layer has a thickness smaller than that of the first silicide compound layer.

* * * * *